United States Patent
Kim et al.

(10) Patent No.: US 8,003,992 B2
(45) Date of Patent: Aug. 23, 2011

(54) LIGHT EMITTING DIODE HAVING A WIRE GRID POLARIZER

(75) Inventors: Jun-youn Kim, Hwaseong-si (KR);
Taek Kim, Seongnam-si (KR);
Kyoung-kook Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 255 days.

(21) Appl. No.: 12/457,138

(22) Filed: Jun. 2, 2009

(65) Prior Publication Data

US 2010/0127238 A1    May 27, 2010

(30) Foreign Application Priority Data

Nov. 27, 2008  (KR) .................. 10-2008-0119011

(51) Int. Cl.
| | | |
|---|---|---|
| H01L 27/15 | (2006.01) | |
| H01L 29/26 | (2006.01) | |
| H01L 31/12 | (2006.01) | |
| H01L 33/00 | (2010.01) | |
| H01L 29/22 | (2006.01) | |
| H01L 29/227 | (2006.01) | |
| H01L 29/06 | (2006.01) | |
| H01L 31/0328 | (2006.01) | |
| H01L 31/0336 | (2006.01) | |
| H01L 31/075 | (2006.01) | |
| H01L 31/109 | (2006.01) | |

(52) U.S. Cl. ...... 257/79; 257/13; 257/98; 257/E33.067; 257/E33.072; 977/701; 977/762; 977/949
(58) Field of Classification Search ............ 257/13, 257/79, 98, E33.067, E33.072; 977/701, 977/762, 949
See application file for complete search history.

(56) References Cited

U.S. PATENT DOCUMENTS

| | | | | |
|---|---|---|---|---|
| 6,841,803 | B2 | 1/2005 | Aizawa et al. | 257/98 |
| 6,847,057 | B1 | 1/2005 | Gardner et al. | 257/99 |
| 7,170,100 | B2 | 1/2007 | Erchak et al. | 257/88 |
| 7,440,044 | B2* | 10/2008 | Peterson et al. | 349/61 |
| 7,638,796 | B2* | 12/2009 | Kwak et al. | 257/40 |
| 7,800,823 | B2* | 9/2010 | Perkins | 359/485.05 |

(Continued)

FOREIGN PATENT DOCUMENTS

KR   2005-070854   7/2005

(Continued)

OTHER PUBLICATIONS

Jianfang Wang et al., "Highly Polarized Photoluminescence and Photodetection from Single Indium Phosphide Nanowires", *Science*, vol. 293, pp. 1455-1457 (Aug. 24, 2001).

(Continued)

*Primary Examiner* — Ida M Soward
(74) *Attorney, Agent, or Firm* — Harness, Dickey & Pierce, P.L.C.

(57) ABSTRACT

Example embodiments provide a light emitting diode (LED) having improved polarization characteristics. The LED may include wire grid polarizers on and below a light emitting unit. The wire grid polarizers may be arranged at an angle to each other. Thus, because the LED may emit a light beam in a given polarization direction, an expensive component, e.g., a dual brightness enhanced film (DBEF), is not required. Thus, manufacturing costs of a backlight unit including the LED and a display apparatus including the backlight unit may be reduced.

25 Claims, 9 Drawing Sheets

U.S. PATENT DOCUMENTS

| | | | |
|---|---|---|---|
| 7,808,011 B2 * | 10/2010 | Kim et al. .................... | 257/98 |
| 2006/0262397 A1 * | 11/2006 | Lee et al. .................... | 359/486 |
| 2007/0076143 A1 * | 4/2007 | Palk et al. .................... | 349/96 |
| 2007/0081253 A1 * | 4/2007 | Yamauchi .................... | 359/619 |
| 2007/0247566 A1 * | 10/2007 | Choo .......................... | 349/96 |
| 2008/0094547 A1 * | 4/2008 | Sugita et al. ................. | 349/96 |
| 2008/0117385 A1 * | 5/2008 | Endo ............................ | 353/20 |
| 2008/0259242 A1 * | 10/2008 | Chiba et al. ................. | 349/62 |
| 2009/0109377 A1 * | 4/2009 | Sawaki et al. ............... | 349/96 |
| 2009/0206354 A1 * | 8/2009 | Kitano et al. ................ | 257/98 |

FOREIGN PATENT DOCUMENTS

| | | |
|---|---|---|
| KR | 2007-0113406 | 11/2007 |
| KR | 10-0818451 | 1/2008 |
| KR | 10-809236 | 2/2008 |

OTHER PUBLICATIONS

Zhiyong Fan et al., "Photoluminescence and polarized photodetection of single ZnO nanowires", *App. Phys. Lett.*, vol. 85, No. 25, pp. 6128-6130 (Dec. 20, 2004).

Song Han et al., "Photoconduction studies on GaN nanowire transistors under UV and polarized UV illumination", *Chem. Phys. Lett.*, vol. 389, pp. 176-180 (2004).

H.E. Ruda et al., "Polarization-sensitive optical phenomena in semiconducting and metallic nanowires", *Phys. Rev.*, vol. B72, 115308 (2005).

10-2008-0003486 Abstract which is the equivalent of KR 10-0818451.

* cited by examiner

LIGHT EMITTING DIODE HAVING A WIRE GRID POLARIZER

CROSS-REFERENCE TO RELATED APPLICATIONS

This application claims priority under 35 USC §119 to Korean Patent Application No. 10-2008-0119011, filed on Nov. 27, 2008, in the Korean Intellectual Property Office (KIPO), the entire contents of which are incorporated herein by reference.

BACKGROUND

1. Field

Example embodiments relate to a light emitting diode (LED), and more particularly, to an LED emitting a light beam having improved polarization characteristics.

2. Description of the Related Art

Light emitting diodes (LEDs) have been used widely in signal devices and advertisement devices in electronic, electric, and communicational fields. For example, LEDs have been used in transportation devices, flashlights, displaying devices, brake lamps, and signboards. LEDs are eco-friendly devices because they do not use mercury (Hg), and have lower power consumption due to their lighter weight. In addition, because LEDs have relatively longer lifetime and higher reliability, it is expected that LEDs will replace conventional lightings. Also, because the driving circuits for LEDs are simpler and controlling R/G/B color signals may be easier, LEDs may be used in digital lightings and back light units (BLUs).

Recently, cold cathode fluorescent lamps (CCFLs) have been used as backlight units in liquid crystal displays (LCDs). In addition, because an LCD needs to use a polarized light beam, a polarizer may be disposed on front and rear surfaces of a liquid crystal layer. However, because a light beam emitted from a CCFL is not polarized, about 50% of the light beam emitted from the CCFL may not be used to display an image and may be absorbed by the polarizer or other devices. In order to overcome this problem, a dual brightness enhanced film (DBEF) has been primarily used. Prom the light beam emitted from the CCFL, the DBEF transmits a light beam polarized in a particular direction and reflects a light beam polarized in a perpendicular direction. The reflected light beam may be polarized in order to be transmitted through the DBEF by using an optical material, e.g., a diffuser or retarder. Thus, a ratio of a light beam that is used to display an image with respect to a light beam emitted from the CCFL that is not polarized may be increased. That is, light usage efficiency may be increased. However, the DBEF may be expensive.

A backlight unit including an LED may have longer lifetime and smaller power consumption compared to a backlight unit including a CCFL. In addition, a backlight unit including an LED may realize higher contrast by local dimming, may realize 100%-NTSC color reproduction, and may efficiently control image quality by a rapid response velocity. In addition, because LEDs controlling polarization do not require DBEFS, active research has been conducted on the LEDs. However, a current LED formed of (In)GaN in a film type generates a light beam that is not polarized. Thus, in order to control the polarization of an LED, a polarization state of a reflective light beam may be changed by disposing a polarizer on a light emitting unit, stacking a plurality of layer structures, e.g., DBEFs, or placing a double-refracted material below the light emitting unit. However, when the double-refracted material is placed below the light emitting unit, forming a metal contact for an electrode on the light emitting unit may be difficult.

SUMMARY

Example embodiments include a light emitting diode (LED) that may include an integrated electrode for improving polarization characteristics of an emitted light beam. Additional aspects will be set forth in part in the description which follows and, in part, will be apparent from the description, or may be learned by practice of example embodiments.

According to an example embodiment, a light emitting diode (LED) may include a reflective layer on a substrate; a phase retardation layer on the reflective layer; a first wire grid polarizer on the phase retardation layer and including a plurality of conductive wires arranged in parallel to each other; a light emitting unit on the first wire grid polarizer; and a second wire grid polarizer on the light emitting unit and including a plurality of conductive wires arranged in parallel to each other, wherein the plurality of conductive wires of the first wire grid polarizer are arranged at an angle to the plurality of conductive wires of the second wire grid polarizer.

The first and second wire grid polarizers may simultaneously function as an electrode for the light emitting unit. The light emitting unit may be of a film type and may include a first semiconductor layer doped with a first type of impurities, a second semiconductor layer that is not doped, and a third semiconductor layer doped with a second type of impurities opposite to the first type of impurities, and the second semiconductor layer may be an active layer having a quantum well generating a light beam. For example, the second semiconductor layers may be formed of any one selected from the group consisting of (In)GaN, Zn(Mg)O, InGaAs, InP, and InAs.

The light emitting unit may include a plurality of nano-rods that are vertically disposed between the first wire grid polarizer and the second wire grid polarizer, and a transparent insulating layer between the plurality of nano-rods. Each of the plurality of nano-rods may include a first semiconductor layer doped with a first type of impurities, a second semiconductor layer that is not doped, and a third semiconductor layer doped with a second type of impurities opposite to the first type of impurities, and the second semiconductor layer may be an active layer having a quantum well generating a light beam.

The light emitting unit may include a plurality of nano-dashes each having a rectangular shape with a longer length than a width thereof, and the plurality of nano-dashes may be arranged in parallel to each other. Each of the plurality of nano-dashes may include a first semiconductor layer doped with a first type of impurities, a second semiconductor layer that is not doped, and a third semiconductor layer doped with a second type of impurities opposite to the first type of impurities, and the second semiconductor layer may be an active layer having a quantum well generating a light beam.

A length 'L' and a width 'W' of each of the plurality of nano-dashes may satisfy the inequalities $L/W \geqq 5$ and $W \leqq \lambda/(2n)$, where $\lambda$ is a wavelength of an emitted light beam and 'n' is a refraction index of a material of the plurality of nano-dashes. For example, a width 'W' of each of the plurality of nano-dashes may be in the range of about 5 nm to about 500 nm, a length 'L' of each of the plurality of nano-dashes may be in the range of about 50 nm to about 5 µm, and a pitch between the plurality of nano-dashes may be in the range of about 5 nm to about 500 nm.

The plurality of conductive wires of the second wire grid polarizer may be arranged in a direction perpendicular to a longitudinal direction of each of the plurality of nano-dashes. A space between the plurality of nano-dashes may be filled with a transparent dielectric layer. The plurality of nano-dashes may be surrounded by air. A passivation-treatment may be performed around lateral surfaces of the plurality of nano-dashes.

Pitches between the conductive wires of the first wire grid polarizers and between the conductive wires of the second wire grid polarizers and a width of each of the conductive wires may be less than $\lambda/2$, where $\lambda$ is a wavelength of an emitted light beam. A thickness of each of the plurality of conductive wires of the first and second wire grid polarizers may be in the range of about 20 nm to about 1000 nm.

The first and second wire grid polarizers, and the reflective layer may be formed of any one selected from the group consisting of aluminum (Al), gold (Au), silver (Ag), palladium (Pd), titanium (Ti), platinum (Pt), ZrN, HfN, TiN, $ZrB_2$, $Cr_2N$, $MgB_2$, $NbB_2$, $HfB_2$, $AlB_2$, $Ta_2N$ and NbN, or a metal alloy thereof. The phase retardation layer may be formed of any one selected from a semiconductor material comprising (In)(Al)GaN, (Al)(In)(Ga)(As)(P) or (Mg)ZnO and a dielectric material comprising $SiO_2$, $HfO_2$ or SiNx. The LED may further include a buffer layer formed of a semiconductor material and between the wire grid polarizer and the light emitting unit.

According to an example embodiment, an LED may include a reflective layer on a substrate; a light emitting unit on the reflective layer; and a wire grid polarizer on the light emitting unit and including a plurality of conductive wires arranged in parallel to each other, wherein the light emitting unit may include a plurality of nano-dashes having a rectangular shape with a longer length compared to a width thereof, the plurality of nano-dashes are arranged in parallel to each other, and wherein each of the reflective layer and the plurality of conductive wires function as an electrode.

Each of the plurality of nano-dashes may include a first semiconductor layer doped with a first type of impurities; a second semiconductor layer that is not doped; and a third semiconductor layer doped with a second type of impurities opposite to the first type of impurities, wherein the second semiconductor layer is an active layer having a quantum well generating a light beam.

A length 'L' and a width 'W' of each of the plurality of nano-dashes may satisfy the inequalities $L/W \geqq 5$ and $W \leqq \lambda/(2n)$, where $\lambda$ is a wavelength of an emitted light beam and 'n' is a refraction index of a material of the plurality of nano-dashes.

The plurality of conductive wires of the second wire grid polarizer may be arranged in a direction perpendicular to a longitudinal direction of each of the plurality of nano-dashes.

A pitch between the plurality of conductive wires of the wire grid polarizer and a width of each of the plurality of conductive wires of the wire grid polarizer may be less than $\lambda/2$, where $\lambda$ is a wavelength of an emitted light beam.

BRIEF DESCRIPTION OF THE DRAWINGS

Example embodiments will be more clearly understood from the following detailed description taken in conjunction with the accompanying drawings. FIGS. 1-9 represent non-limiting, example embodiments as described herein.

FIG. 1 illustrates a light emitting diode (LED) according to an example embodiment.

FIG. 2 illustrates the relative arrangement of wire grid polarizers shown with the LED in FIG. 1.

FIG. 3 is a cross-sectional view of the LED taken along a line B-B' of FIG. 2.

FIG. 5 is a perspective view of an LED according to example embodiments.

FIG. 6 is a schematic plan view of an LED according to example embodiments.

FIG. 9 is a cross-sectional view of an LED according to another example embodiment.

Figure 1:
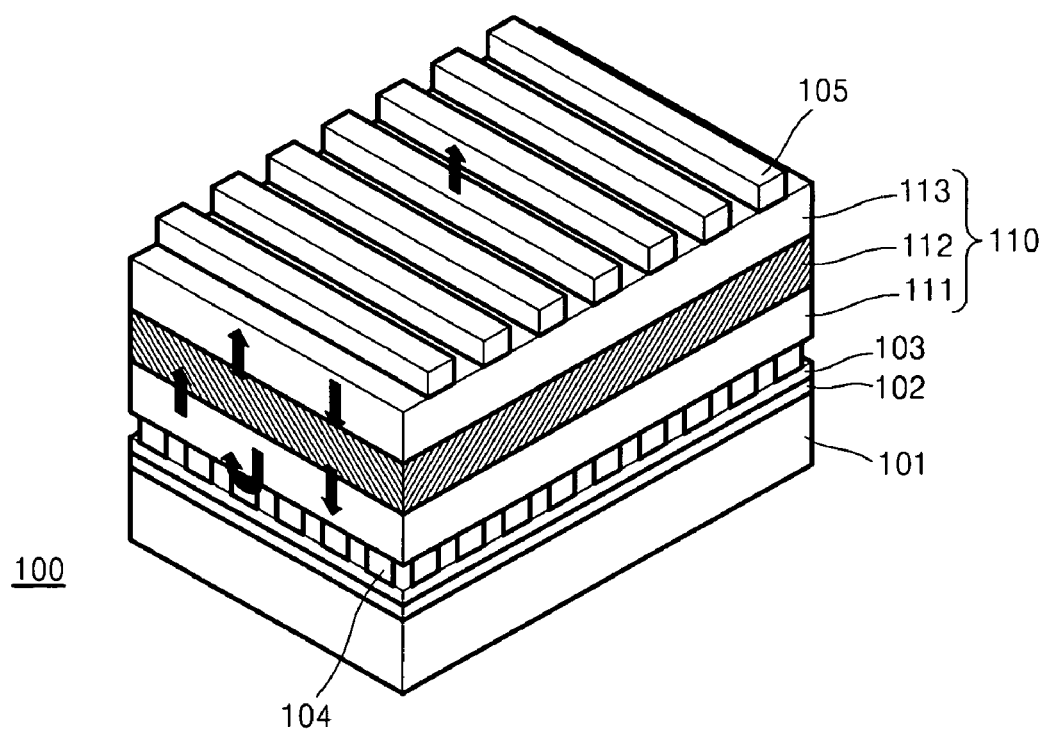

It should be noted that these drawings are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Hereinafter, example embodiments of a light emitting diode and a method of fabricating a light emitting diode (LED) will be described with reference to the attached drawings. Example embodiments may, however, be embodied in many different forms and should not be construed as limited to the embodiments set forth herein. Rather, these embodiments are provided so that this disclosure will be thorough and complete, and will fully convey the scope of example embodiments to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 illustrates an LED 100 according to an example embodiment. Referring to FIG. 1, the LED 100 may include a substrate 101, a reflective layer 102 disposed on the substrate 101, a phase retardation layer 103 disposed on the reflective layer 102, a first wire grid polarizer 104 disposed on the phase retardation layer 103, a light emitting unit 110 disposed on the first wire grid polarizer 104, and a second wire grid polarizer 105 disposed on the light emitting unit 110. The light emitting unit 110 may include a light emissive structure formed as a p-i-n junction so that a light beam may be emitted from the light emitting unit 110.

As illustrated in FIG. 1, the light emitting unit 110 may include a first semiconductor layer 111 doped with a first type of impurities, a second semiconductor layer 112 that is not doped, and a third semiconductor layer 113 doped with a second type of impurities. The first semiconductor layer 111 and the third semiconductor layer 113 may be doped with opposite types of impurities. For example, the first semiconductor layer 111 may be doped with n-type impurities and the third semiconductor layer 113 may be doped with p-type impurities. In an additional example embodiment, the first semiconductor layer 111 may be doped with p-type impurities and the third semiconductor layer 113 may be doped with n-type impurities. The second semiconductor layer 112 may be an active layer having a quantum well that receives electrons and holes from first and third semiconductor layers 111 and 113 and recombines the electrons and the holes to generate a light beam.

Example embodiments provide that the light emitting unit 110 may be formed of a semiconductor material, e.g., (In)GaN, Zn(Mg)O, InGaAs, InGaAsP, InP and InAs. For example, the second semiconductor layer 112 functioning as an active layer may include a single or multiple quantum well that may be formed by periodically changing each component of the above (In)GaN, Zn(Mg)O, InGaAs, InGaAsP, InP and InAs to adjust band intervals. The first and third semiconductor layers 111 and 113 may be lattice-matched to the second semiconductor layer 112, and further may be formed of a material having a large energy band. For example, the first semiconductor layer 111 doped with n-type impurities may be formed of n-(Al)(In)GaN, n-Zn(Mg)O, n-(Al)InGaAs, n-(Al)InGaAsP, n-(Al)InP or n-(Al)InAs, and the third semiconductor layer 113 doped with a p-type may be formed of p-(Al)(In)GaN, p-Zn(Mg)O, p-(Al)InGaAs, p-(Al)InGaAsP, p-(Al)InP or p-(Al)InAs.

The first wire grid polarizer 104 may be disposed below the light emitting unit 110 and the second wire grid polarizer 105 may be disposed on the light emitting unit 110. As schematically illustrated in FIG. 1, the first and second wire grid polarizers 104 and 105 may have a shape in which a plurality of slim and long conductive wires are arranged parallel to each other. The first and second wire grid polarizers 104 and 105 may be arranged at given intervals. The second wire grid polarizer 105 may determine a direction of a polarizing component of a light beam emitted from the LED 100. In order to achieve this, conductive wires of the second wire grid polarizer 105 may be arranged in a direction perpendicular to the direction of the polarizing component of the light beam emitted from the LED 100. However, example embodiments also provide that the first wire grid polarizer 104 may depolarize a polarizing state of a light beam reflected by the second wire grid polarizer 105. According to the example embodiment shown in FIG. 2, the first wire grid polarizer 104 may be arranged at a given angle to the second wire grid polarizer 105. For example, an angle between the first wire grid polarizer 104 and the second wire grid polarizer 105 may be about 45°.

The general characteristics of the first and second wire grid polarizers 104 and 105 will now be described. When a light beam having a polarization component parallel to a longitudinal direction of a conductive wire is incident on the first and second wire grid polarizers 104 and 105, free electrons in the conductive wire may oscillate along the longitudinal direction. Electromagnetic waves may be generated according to electromagnetic induction. Because a portion of the electromagnetic waves is absorbed to the first and second wire grid polarizers 104 and 105 in a direction in which the electromagnetic waves penetrate, the other portion of the electromagnetic waves may be reflected. Thus, the first and second wire grid polarizers 104 and 105 may exhibit higher-reflectivity characteristics with respect to a polarization component parallel to the longitudinal direction of the conductive wire. In an additional example embodiment, when a light beam having a polarization component perpendicular to the longitudinal direction of the conductive wire is incident on the first and second wire grid polarizers 104 and 105, free electrons in the conductive wire may oscillate in a width direction of the conductive wire. However, because the width of the conductive wire is too narrow, the oscillation of the free electrons in the width direction may be performed in a limited space. Thus, electromagnetic waves may not be adequately induced, and most of the light beam may be transmitted through the first and second wire grid polarizers 104 and 105. Accordingly, the first and second wire grid polarizers 104 and 105 may exhibit higher-transmittance characteristics with respect to a polarization component perpendicular to the longitudinal direction of the conductive wire. Based on such characteristics, the first and second wire grid polarizers 104 and 105 may function as a polarizer.

At least one additional example embodiment provides that the first and second wire grid polarizers 104 and 105 may have the characteristics of a diffraction grating. As an interval, such as a pitch for example, between conductive wires is narrower, the first and second wire grid polarizers 104 and 105 may exhibit the weaker characteristics of a diffracting grating and the stronger characteristics of a polarizer. As the pitch between conductive wires is wider, the first and second wire grid polarizers 104 and 105 may exhibit the stronger characteristics of a diffracting grating and the weaker characteristics of a polarizer. According to at least one example embodiment, in order to reduce or prevent exhibition of the diffracting characteristics, the pitch ($P_m$) between the conductive wires may be less than about $\lambda/2$ (where $\lambda$ is the wavelength of an emitted light beam). In addition, the width ($W_m$) of the conductive wire may be sufficiently narrow to reduce or prevent generation of the electromagnetic waves generated by the oscillation of the free electrons in the width direction. In order to reduce or minimize generation of the electromagnetic waves, the width (Wm) of the conductive wire may be less than about $\lambda/2$. The thickness (tm) of the conductive wire may be about equal to or greater than 20 nm in order to reduce or prevent the electromagnetic waves induced by the oscillation of the free electrons in the longitudinal direction from transmitting through the conductive wire, and may be about equal to smaller than 1000 nm due to light absorbance considerations.

The first and second wire grid polarizers 104 and 105 may be formed of, for example, aluminum (Al), gold (Au), silver (Ag), palladium (Pd), titanium (Ti), platinum (Pt), ZrN, HfN, TiN, $ZrB_2$, $Cr_2N$, $MgB_2$, $NbB_2$, $HfB_2$, $AlB_2$, $Ta_2N$, or NbN, which may be used alone in a combination of two or more as an alloy. For example, by stacking $ZrN/ZrB_2$ as the wire grid polarizers 104 and 105, an ohmic contact may be obtained. A material used for forming the first and second wire grid polarizers 104 and 105 may be changed according to at least one example embodiment of methods of fabricating the LED 100. For example, when the first, second and third semiconductor layers 111, 112 and 113 of the light emitting unit 110 are grown and the first and second wire grid polarizers 104 and 105 are formed, any material listed among the materials above may be used. For example, when the first and second wire grid polarizers 104 and 105 are formed and the first, second and third semiconductor layers 111, 112 and 113 of the light emitting unit 110 are grown, a material, e.g., ZrN, HfN, TiN, $ZrB_2$, or NbN, may be used in order to withstand higher growing temperatures.

According to at least one example embodiment, because the first and second wire grid polarizers 104 and 105, formed below and on the light emitting unit 110, respectively, have higher electric conductivity, the first and second wire grid polarizers 104 and 105 may be used as an electrode (that is, a metal contact) of the light emitting unit 110. Thus, it may not be required that a separate electrode layer be formed, thereby simplifying the structure of the LED 100 and reducing manufacturing costs. An additional example embodiment further provides that, if the first and second wire grid polarizers 104 and 105 are used as the electrode, a bonding pad of the package may be connected to the first and second wire grid polarizers 104 and 105 via a bonding wire when the LED 100 is packaged.

The phase retardation layer 103 and the reflective layer 102 may be disposed in that order below the first wire grid polarizer 104. A light beam may be reflected by the second wire grid polarizer 105 and may be transmitted through the first wire grid polarizer 104. The phase retardation layer 103 may retard a phase of the light beam, and may rotate the polarization of the light beam. In addition, a light beam that has been reflected by the second wire grid polarizer 105 may be reflected by the reflective layer 102 back to the second wire grid polarizer 105, thereby facilitating reuse of the light beam. The phase retardation layer 103 may be formed of a semiconductor material, e.g., (In)(Al)GaN, (Al)(In)(Ga)(As)(P) or (Mg)ZnO, or a dielectric material, e.g., $SiO_2$, $HfO_2$ or SiNx. The reflective layer 102 may be formed of, for example, aluminum (Al), gold (Au), silver (Ag), palladium (Pd), titanium (Ti), platinum (Pt), ZrN, HfN, TiN, $ZrB_2$, $Cr_2N$, $MgB_2$, $NbB_2$, $HfB_2$, $AlB_2$, $Ta_2N$, or NbN. The reflective layer 102 may be a distributed Bragg reflector (DBR) formed by alternately stacking two semiconductor materials having different refraction indexes. A DBR may have a reflectivity of approximately 100% with respect to a particular wavelength when an appropriate number of semiconductor material layers are stacked and each of the semiconductor material layers has a given thickness. When the phase retardation layer 103 and the reflective layer 102 are formed of the materials described above, the reflective layer 102 may function as a metal contact receiving a current from the outside. In at least one example embodiment, circumferential portions of the reflective layer 102 and the first wire grid polarizer 104 may be electrically connected to each other.

Figure 2:
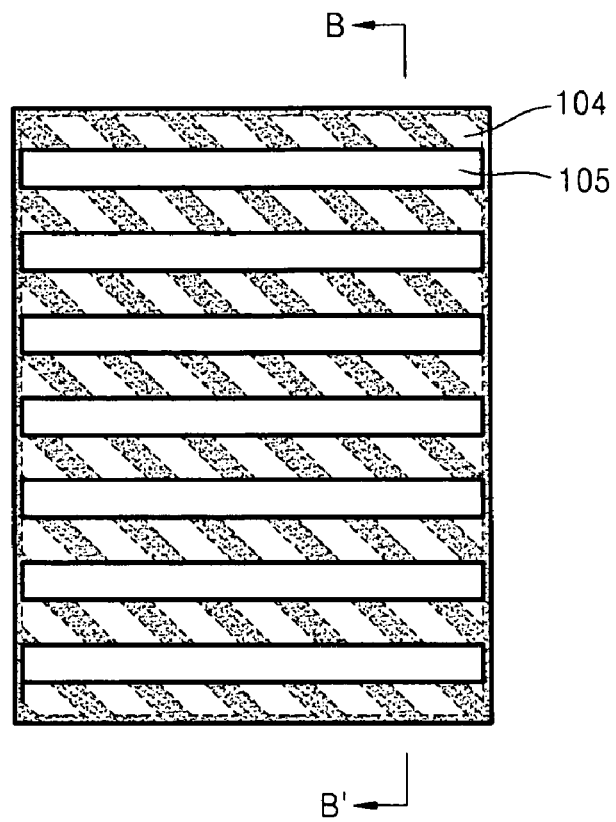
Figure 3:
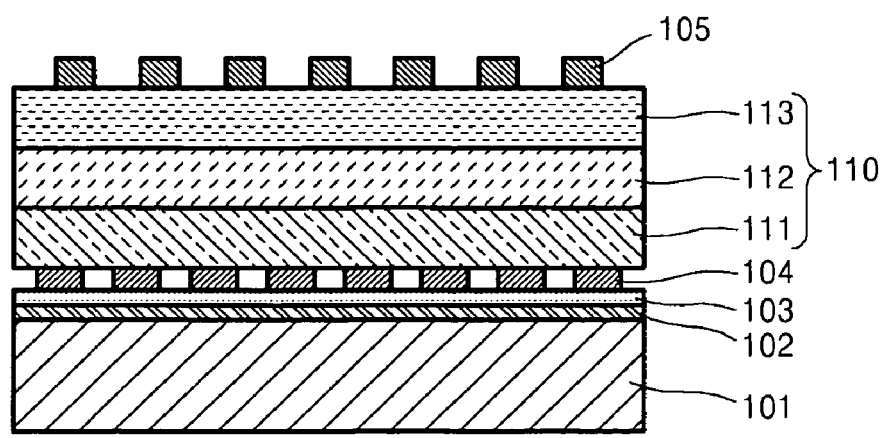

FIG. 3 is a cross-sectional view of the LED 100 according to an example embodiment taken along a line B-B' of FIG. 2. An operation of the LED 100 according to at least one example embodiment will now be described. A current may be supplied to the light emitting unit 110 through the first and second wire grid polarizers 104 and 105. The electrons and holes provided from the first and third semiconductor layers 111 and 113 may be recombined to generate a light beam. The light beam may be in a non-polarization state. A portion of the light beam may be emitted through the second wire grid polarizer 105 to the outside. The emitted light beam may have a polarization component perpendicular to a longitudinal direction of conductive wires of the second wire grid polarizer 105. Other portions of the light beam may be reflected by the second wire grid polarizer 105 and may proceed towards the first wire grid polarizer 104. Portions of a light beam having a polarization component perpendicular to a longitudinal direction of conductive wires of the first wire grid polarizer 104 may be transmitted through the first wire grid polarizer 104, and other portions of the light beam may be reflected by the first wire grid polarizer 104. The light beam transmitted through the first wire grid polarizer 104 may be transmitted through the phase retardation layer 103, may be reflected by the reflective layer 102, and may be transmitted through the phase retardation layer 103. A light beam having a polarization component perpendicular to the longitudinal direction of the conductive wires of the first wire grid polarizer 104 may be transmitted through the first wire grid polarizer 104, and may change to a non-polarization state together with the reflected light beam. Thus, a portion of the light beam may be emitted through the second wire grid polarizer 105 to the outside. Accordingly, the LED 100 may generate a light beam having improved polarization characteristics.

Figure 4A:
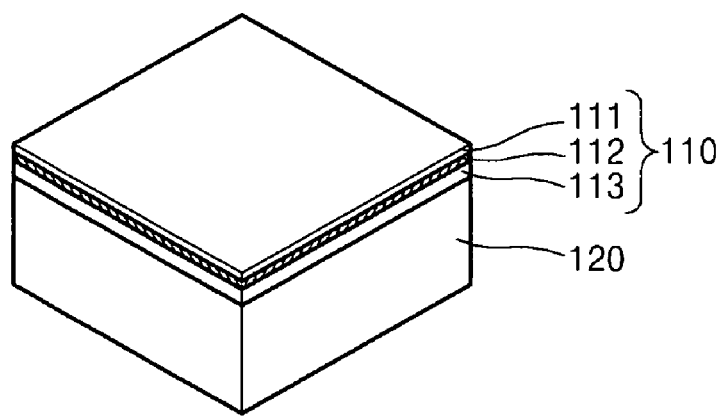
FIGS. 4A-4F are perspective views of a method of fabricating the LED of FIG. 1 according to an example embodiment.
Figure 4B:
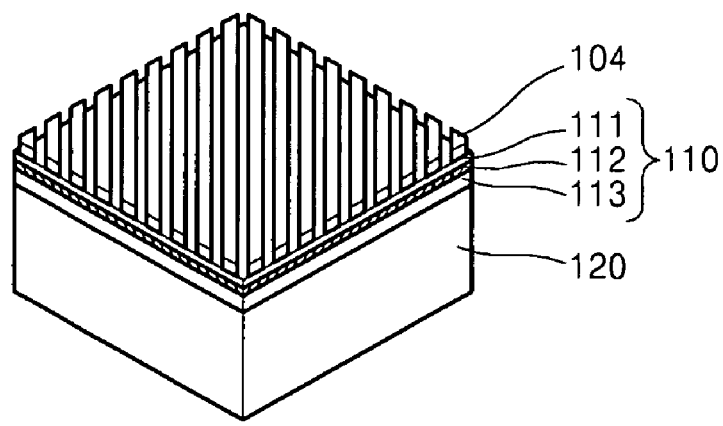

FIGS. 4A-4F are perspective views of a method of fabricating the LED 100 of FIG. 1, according to an example embodiment. Referring to FIG. 4A, the light emitting unit 110 may be grown on a growth substrate 120, e.g., a sapphire substrate, using a general semiconductor growth method. In a reverse order to the order illustrated in FIG. 1, the light emitting unit 110 may be grown from the third semiconductor layer 113 to the first semiconductor layer 111. Additionally, the order in which the first, second, and third semiconductor layers 111, 112 and 113 of the light emitting unit 110 are stacked may be reversed. As illustrated in FIG. 4B, the first wire grid polarizer 104 may be formed on the light emitting unit 110. The conductive wires of the first wire grid polarizer 104 may be approximately diagonally arranged with respect to the light emitting unit 110. Because the growth of the light emitting unit 110 requiring a higher temperature process is completed, the first wire grid polarizer 104 may be formed of any material from among aluminum (Al), gold (Au), silver (Ag), palladium (Pd), titanium (Ti), platinum (Pt), ZrN, HfN, TiN, $ZrB_2$, $Cr_2N$, $MgB_2$, $NbB_2$, $HfB_2$, $AlB_2$, $Ta_2N$ and NbN.

Figure 4C:
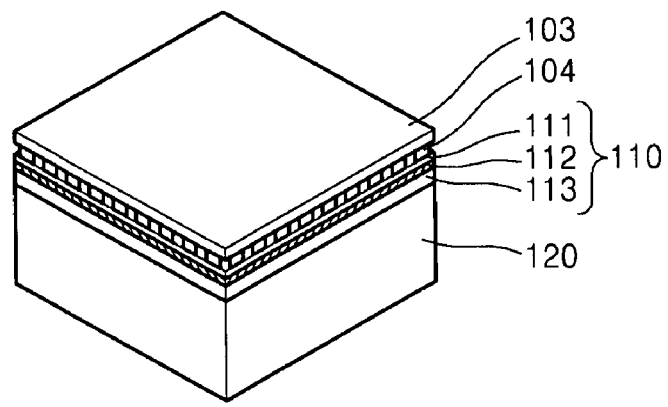
Figure 4D:
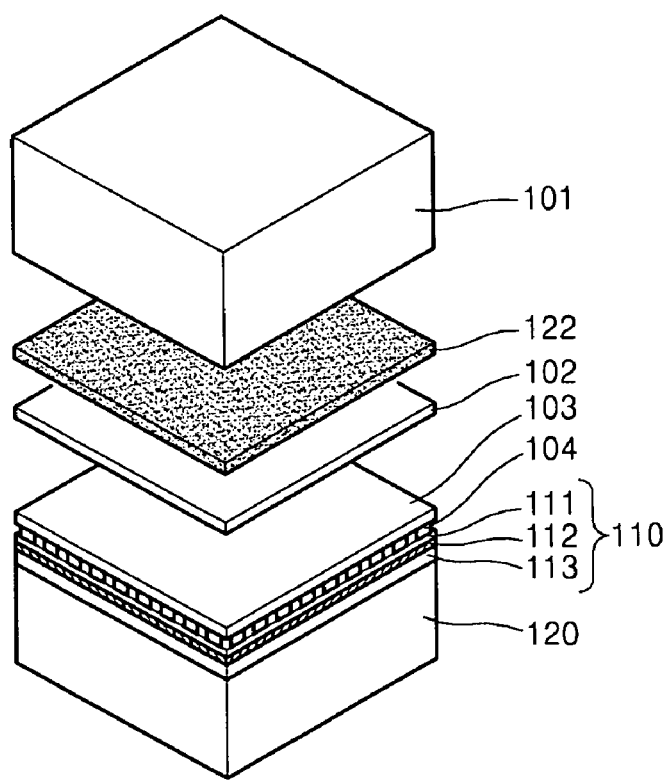

As illustrated in FIG. 4C, the phase retardation layer 103 may be formed of the semiconductor material or dielectric material is disposed on the first wire grid polarizer 104. As illustrated in FIG. 4D, the reflective layer 102 may be formed on the phase retardation layer 103. Although not shown, when the reflective layer 102 is used as a contact for receiving an external current, circumferential portions of the first wire grid polarizer 104 and the reflective layer 102 may be electrically connected. The substrate 101 may be connected onto the reflective layer 102 using, for example, a bonding metal 122. The substrate 101 may function as a support substrate for subsequent processes, and may be, for example, a silicon (Si) substrate.

Figure 4E:
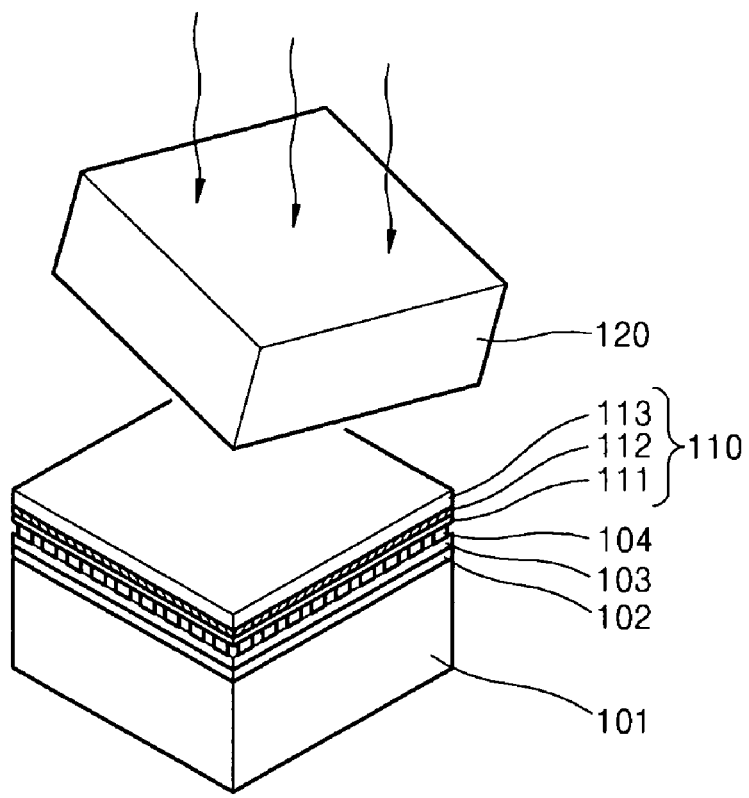
Figure 4F:
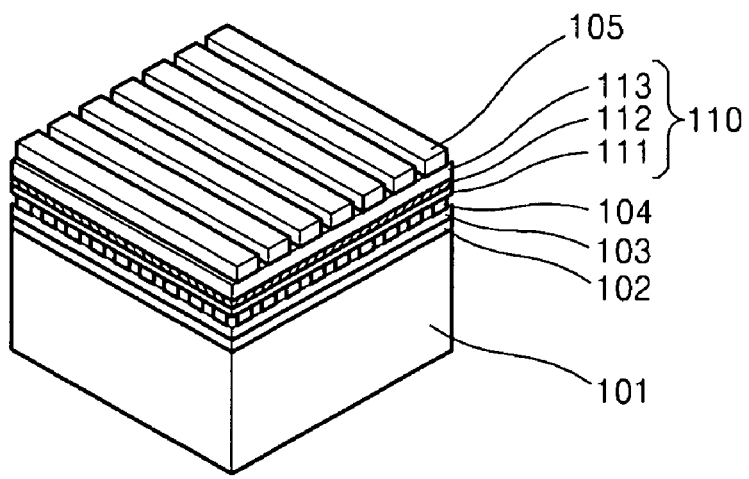

The growth substrate 120 may be removed using, for example, a laser lift-off process or a chemical lift-off process. FIG. 4E illustrates an example embodiment of an operation of removing the growth substrate 120. It is noted that an inverse structure of that illustrated in FIG. 4D is illustrated in FIG. 4E. Also, as illustrated in FIG. 4F, the second wire grid polarizer 105 may be formed on the light emitting unit 110 that is exposed by removing the growth substrate 120. The conductive wires of the second wire grid polarizer 105 may be arranged at an angle to the conductive wires of the first wire grid polarizer 104. In FIGS. 4B and 4F, the first wire grid polarizer 104 may be diagonally arranged with respect to a side of the light emitting unit 110, and the second wire grid polarizer 105 may be arranged in parallel to the side of the light emitting unit 110. However, this arrangement is only for illustrative purposes, and thus the first and second wire grid polarizers 104 and 105 may be arranged in an opposite manner. It is noted that numerous variations in addition to the example embodiment illustrated herein may be arranged. The second wire grid polarizer 105 may also be formed of any material from among aluminum (Al), gold (Au), silver (Ag), palladium (Pd), titanium (Ti), platinum (Pt), ZrN, HfN, TiN, $ZrB_2$, $Cr_2N$, $MgB_2$, $NbB_2$, $HfB_2$, $AlB_2$, $Ta_2N$ and NbN.

In FIGS. 4A through 4F, the light emitting unit 110 may be grown, and the first and second wire grid polarizers 104 and 105 may be formed. The substrate 101 through the second wire grid polarizer 105 may be sequentially formed from the substrate 101 towards the second wire grid polarizer 105 in the order illustrated in FIG. 1. In at least one example embodiment, at least the first wire grid polarizer 104 may be formed of ZrN, HfN, TiN, $ZrB_2$, $Cr_2N$, $MgB_2$, $NbB_2$, $HfB_2$, $AlB_2$, $Ta_2N$ or NbN so that the first wire grid polarizer 104 disposed below the light emitting unit 110 may withstand a higher temperature during the growth of the light emitting unit 110. Although not illustrated in FIG. 1, a buffer layer may be formed on the first wire grid polarizer 104 in order to easily form the first, second, and third semiconductor layers 111, 112 and 113 on the first wire grid polarizer 104. The buffer layer may be formed of a semiconductor material, e.g., (Al) GaN.

Figure 5:
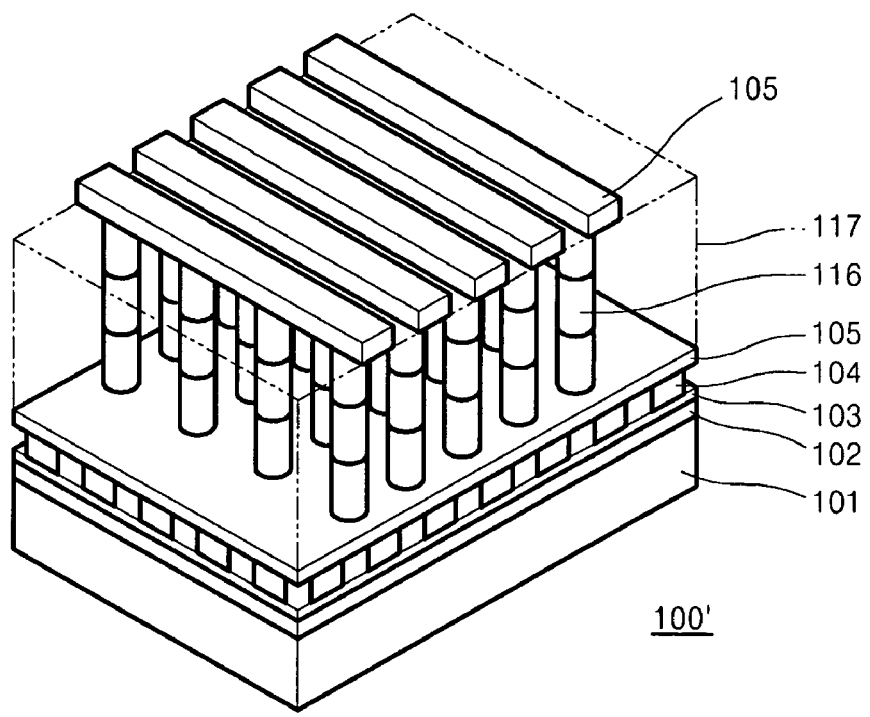

Example embodiments described above include forming each of the first, second and third semiconductor layers 111, 112 and 113 of the light emitting unit 110 in a film type. However, at least one example embodiment also includes forming each of the first, second and third semiconductor layers 111, 112 and 113 as a nano-rod. FIG. 5 is a schematic structural view of an LED 100' using a nano-rod, according to an example embodiment. Referring to FIG. 5, the LED 100' may be different from the LED 100 of FIG. 1 in that the semiconductors of a light emitting unit include a plurality of fine nano-rods.

Like in the case of the light emitting unit 110 of FIG. 1, each of the nano-rods 116 may include a first semiconductor layer doped with a first type of impurities, a third semiconductor layer doped with a second type of impurities opposite to the first type of impurities, and a second semiconductor layer that is not doped. The second semiconductor layer may function as an active layer between the first and third semiconductor layers. The nano-rods 116 may be vertically or angularly disposed between the first wire grid polarizer 104 and the second wire grid polarizer 105. A space between the nano-rods 116 may be filled with a transparent insulating layer 117 formed of a dielectric material. Although not illustrated, a passivation layer formed of, for example, AlN, may be formed on circumferential surfaces of the nano-rods 116 in order to prevent a current leakage. In addition, a buffer layer 115 may be disposed between the nano-rods 116 and the first wire grid polarizer 104. The buffer layer 115 may be required to facilitate forming a semiconductor on the first wire grid polarizer 104 when the substrate 101 through the second wire grid polarizer 105 are sequentially stacked.

Figure 6:
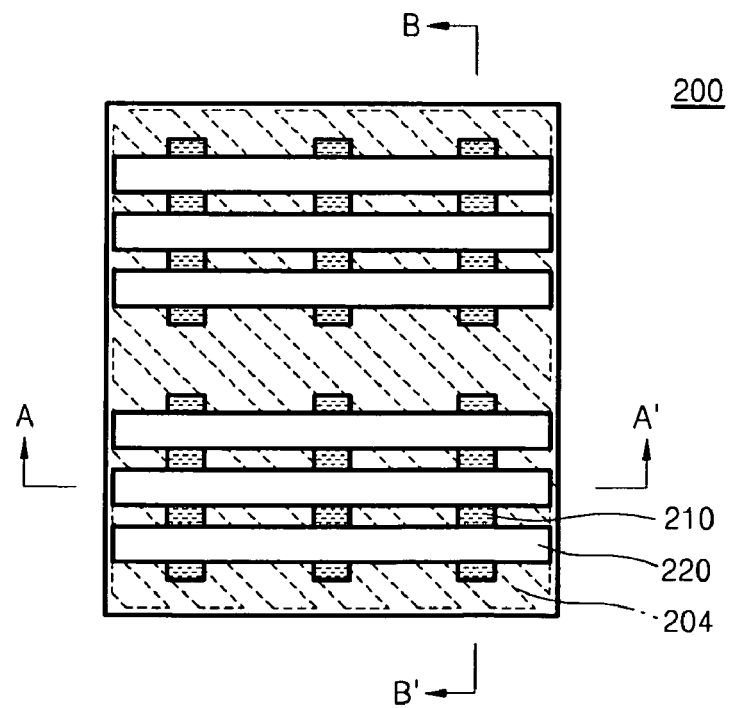
Figure 7A:
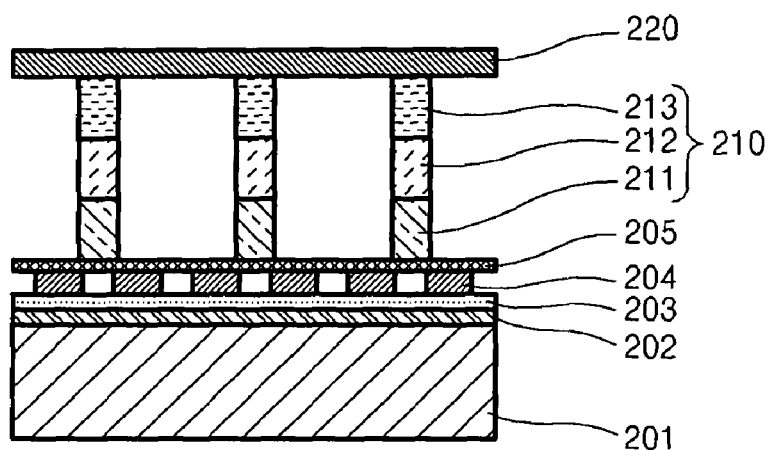
FIGS. 7A and 7B are cross-sectional views of the LED taken along lines A-A' and B-B' of FIG. 6, respectively.
Figure 7B:
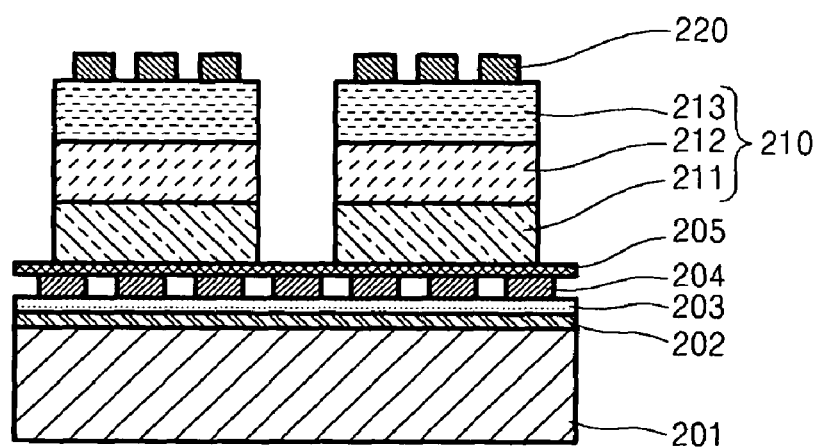

At least one example embodiment provides that a nano-dash in which side surfaces of a plurality of nano-rods or nano-wires are attached to each other may be used as a light emitting unit. A nano-dash may be formed of the same material and have the same characteristics as a nano-rod or a nano-wire except that the nano-dash has a rectangular shape with a longer length compared to a width thereof. In particular, because a light beam generated from the nano-dash has a stronger dipole moment in a major axis direction compared to in a minor axis direction, an LED including the nano-dash may generate a polarized light beam. FIG. 6 is a schematic plan view of an LED 200 including a plurality of nano-dashes 210, according to an example embodiment. FIGS. 7A and 7B are cross-sectional views of the LED 200 taken along lines A-A' and B-B' of FIG. 6, respectively.

Referring to FIGS. 6, 7A and 7B, a first wire grid polarizer 204 may be disposed below the nano-dashes 210 and may have a rectangular shape. A second wire grid polarizer 220 may be disposed on the nano-dashes 210 and may have a rectangular shape. A phase retardation layer 203, a reflective layer 202 and a substrate 201 may be disposed below the first wire grid polarizer 204. In addition, a buffer layer 205 may be disposed between the nano-dashes 210 and the first wire grid polarizer 204 in order to facilitate growing the nano-dashes 210. The nano-dashes 210 may include a light emitting structure formed as a p-i-n junction in order to emit a light beam. Thus, each of the nano-dashes 210 may include a first semiconductor layer 211 doped with a first type of impurities, a second semiconductor layer 212 that is not doped, and a third semiconductor layer 213 doped with a second type of impurities opposite to the first type of impurities. The second semiconductor layer 212 may be an active layer having a quantum well that receives electrons and holes from the first and third semiconductor layers 211 and 213 and may recombine the electrons and the holes to generate a light beam.

A light beam generated from the nano-dash 210 may have a stronger dipole moment in a major axis direction relative to a minor axis direction. Thus, the nano-dash 210 may emit a light beam polarized in a longitudinal direction of the nano-dash 210. The length 'L' of the nano-dash 210 may be longer than the width 'W' of the nano-dash so that the nano-dash 210 may emit a light beam that is polarized. For example, when L/W is greater than or equal to 5 (L/W$\geq$5), and W$\leq\lambda/(2n)$, where $\lambda$ is the wavelength of an emitted light beam and 'n' is the refraction index of a material of the nano-dash 210, the nano-dash 210 may emit a light beam having a higher polarization ratio.

As illustrated in FIG. 6, because the nano-dashes are arranged parallel to each other, a portion of a light beam emitted from the LED 200 may be polarized in the longitudinal direction of the nano-dash 210. Thus, conductive wires of the second wire grid polarizer 220 may be arranged in a direction perpendicular to the longitudinal direction of the nano-dash 210 so that a portion of the light beam emitted from the nano-dashes 210 may be transmitted through the second wire grid polarizer 220 disposed on the nano-dashes 210. As illustrated in the LED 100 of FIG. 1 and LED 100' of FIG. 5, the first wire grid polarizer 204 may be arranged at an angle to the second wire grid polarizer 220. For example, an angle of deviation between the first wire grid polarizer 204 and the second wire grid polarizer 220 may be approximately 45°. At least one example embodiment further provides that the first and second wire grid polarizers 204 and 220 may function as an electrode with respect to the nano-dashes 210.

Figure 8A:
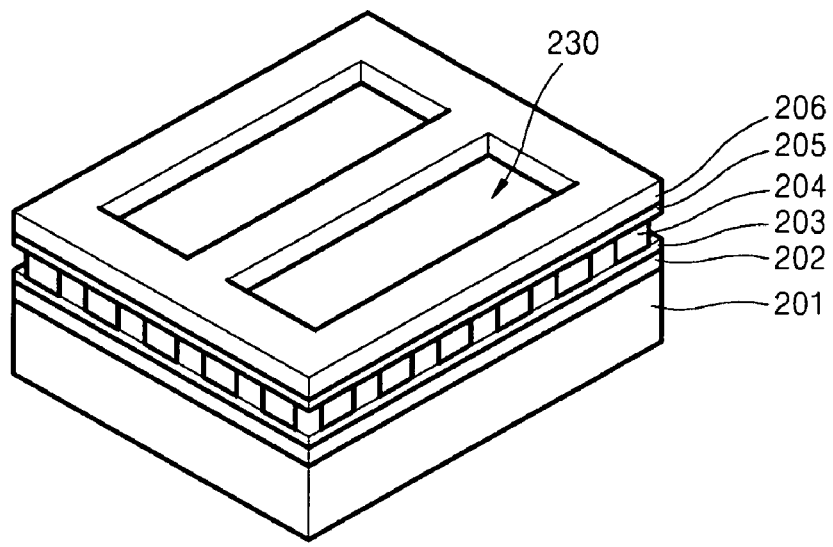
FIGS. 8A through 8C are views for explaining a method of fabricating the nano-dashes of FIG. 6, according to an example embodiment.
Figure 8B:
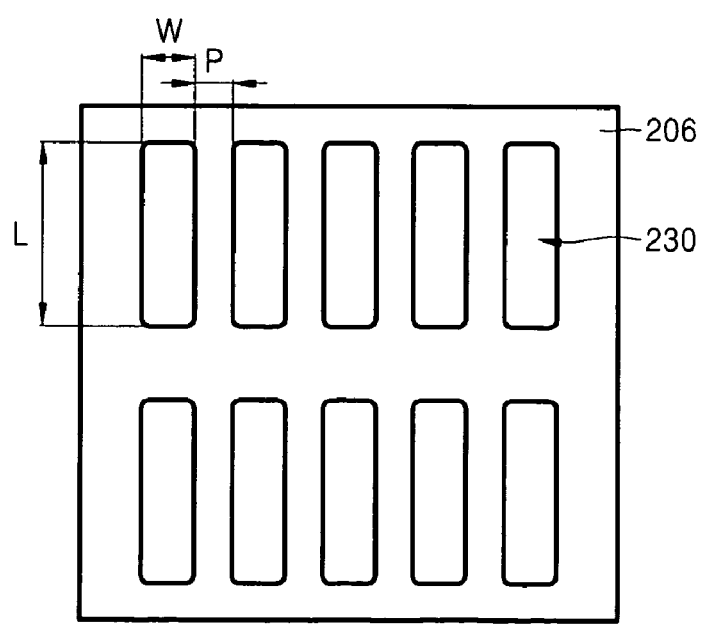
Figure 8C:
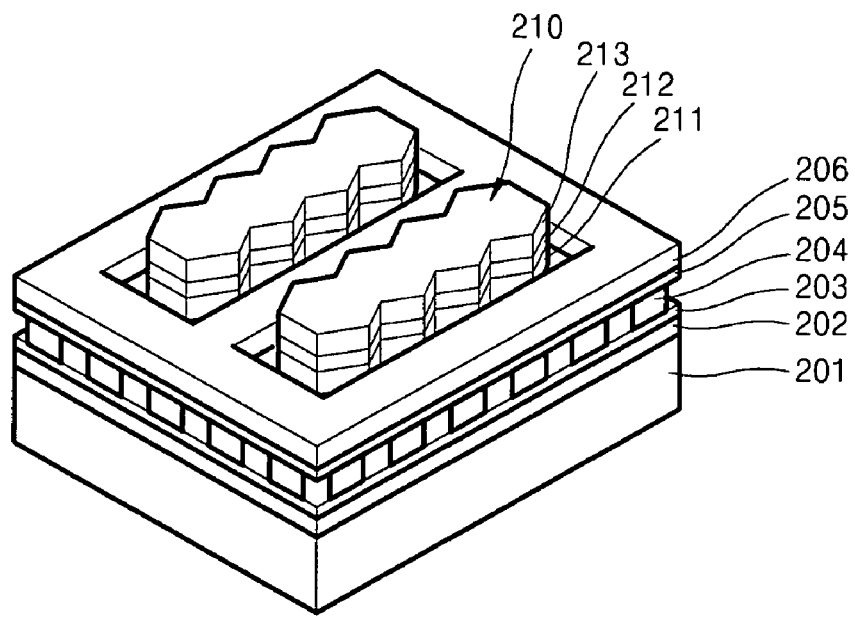

FIGS. 8A through 8C illustrate a method of fabricating the nano-dashes 210 of FIG. 6 according to example embodiments. Referring to FIGS. 8A and 8B, the reflective layer 202, the phase retardation layer 203, the first wire grid polarizer 204 and the buffer layer 205 may be sequentially formed on the substrate 201. A template layer 206 may be formed on the buffer layer 205. The template layer 206 may be used to define the sizes of the nano-dashes 210 and a location at which the nano-dashes 210 are grown. As illustrated in FIGS. 8A and 8B, the template layer 206 may include a plurality of fine opening regions 230, which may be arranged in an array shape. The opening regions 230 may be formed by stacking the template layer 206 of a transparent dielectric material, e.g., $SiO_2$, $SiN_x$, $Al_2O_3$, AlN, or HfO, on an entire surface of the buffer layer 205 formed of GaN, patterning the template layer 206 by using a lithography process, and etching the template layer 206 so as to expose a portion of the buffer layer 205 using an etching method. The location and size of the opening regions 230 may be similar to or identical to the nano-dash 210, which may be formed in a subsequent process. For example, the thickness of the template layer 206 may be in the range of about 100 nm to about 2 μm. The width 'W' of the opening region 230 may be in the range of about 5 nm to about 500 nm. The length 'L' of the opening region 230 may be in the range of about 50 nm to about 5 μm. A pitch 'P' between the opening regions 230 may be in the range of about 5 nm to about 500 nm. In FIGS. 8A and 8B, only several opening regions 230 each having a rectangular shape are illustrated. However, example embodiments are not limited thereto, and many varieties opening regions 230 may be formed on the template layer 206.

In order to pattern the opening regions 230, a lithography process may be performed using, for example, a KrF excimer laser, or an ArF excimer laser. Because the wavelength of a laser beam emitted from such excimer laser is approximately 248 nm or 193 nm, it may be difficult to pattern the opening region 230 having the width 'W'. In an example embodiment, the width 'W' of the opening region 230 may be reduced by forming the open regions 230 and forming a dielectric layer (not shown) on an inner wall of the opening region 230. For example, the dielectric layer may be coated on an entire surface of the template layer 206 in which the opening regions 230 are formed, and an etching process may be performed until portions of the buffer layer 205 corresponding to the opening regions 230 are exposed. Thus, portions of the dielectric layer may be left on the inner walls of the opening regions 230. Accordingly, the width 'W' of the opening region 230 may be reduced. Such method is generally known as a sidewall pattern transfer method, but example embodiments are not limited thereto.

The nano-dashes 210 may be grown in the opening regions 230 of the template layer 206 using a metal catalyst or using a nucleation site, for example. When a metal catalyst is used, a metal, e.g., Au, Ni, Fe or Ni nitrate, may be deposited on the template layer 206, and the metal may be heated. Thus, the metal catalyst having a shape in which a plurality of nano-dots are lumped may be formed in the opening regions 230. The nano-dashes 210 may be grown using a vapour-liquid-solid growth method, for example. In addition, when a nucleation site is used, the nucleation sites may be lumped in the opening regions 230, and the nano-dashes 210 may be grown using a hydride vapour phase epitaxy method, a metal organic vapour phase epitaxy method, a metal organic chemical vapor deposition method, or a halide chemical vapour deposition method. The nano-dashes 210 may also be formed of the semiconductor material described above, e.g., (In)GaN, Zn(Mg)O, InGaAs, InGaAsP, InP, or InAs.

FIG. 8C illustrates an example embodiment of forming the nano-dashes 210 in the opening regions 230. The nano-dashes 210 may be formed, and passivation-treatment may be performed using AlN around lateral surfaces of the nano-dashes 210, like in the nano-rods 116 of FIG. 5. In addition, although not illustrated, a space between the nano-dashes 210 may be filled with a transparent insulating layer (not shown), like in the nano-rods 116 of FIG. 5. The second wire grid polarizer 220 may be formed on the nano-dashes 210. An LED according to the example embodiments discussed above may be directly used. However, the transparent insulating layer formed of a dielectric material and the template layer 206 may be removed by etching, thereby completing the manufacture of the LED 200 of FIGS. 6, 7A and 7B. Because the nano-dashes 210 are surrounded by air having a relatively lower dielectric constant, a polarization factor and polarization contrast may be improved when the dielectric material between the nano-dashes 210 are removed.

Figure 9:
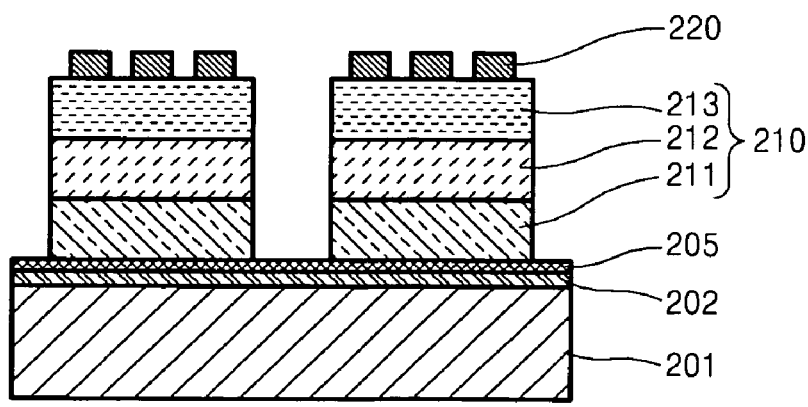

The second wire grid polarizer 220 may be formed only on the nano-dashes 210 and may be formed without the first wire grid polarizer 204. Higher light usage efficiency may be realized due to the presence of the nano-dashes 210 and because the LED 200 emits a polarized light beam. FIG. 9 is a cross-sectional view of an LED 200' in which wire grid polarizers 220 are disposed on only the nano-dashes 210, according to an example embodiment. Because there is no wire grid polarizer below the nano-dashes 210, the phase retardation layer 203 may be omitted. In at least one example embodiment, the reflective layer 202 disposed below the nano-dashes 210 may function as an electrode.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A light emitting diode (LED) comprising:
    a reflective layer on a substrate;
    a phase retardation layer on the reflective layer;
    a first wire grid polarizer on the phase retardation layer and including a plurality of conductive wires arranged in parallel to each other;
    a light emitting unit on the first wire grid polarizer; and
    a second wire grid polarizer on the light emitting unit and including a plurality of conductive wires arranged in parallel to each other,
    wherein the plurality of conductive wires of the first wire grid polarizer are arranged at an angle to the plurality of conductive wires of the second wire grid polarizer.

2. The LED of claim 1, wherein the first and second wire grid polarizers function as an electrode for the light emitting unit.

3. The LED of claim 1, wherein the light emitting unit is of a film type and comprises:
    a first semiconductor layer doped with a first type of impurities;
    a second semiconductor layer that is not doped; and
    a third semiconductor layer doped with a second type of impurities opposite to the first type of impurities, wherein the second semiconductor layer is an active layer having a quantum well generating a light beam.

4. The LED of claim 3, wherein the first, second and third semiconductor layers are formed of one selected from the group consisting of (Al)(In)GaN, Zn(Mg)O, (Al)InGaAs, (Al)InGaAsP, (Al)InP, (Al)InAs and any mixture thereof.

5. The LED of claim 1, wherein the light emitting unit further comprises:
   a plurality of nano-rods vertically disposed between the first wire grid polarizer and the second wire grid polarizer; and
   a transparent insulating layer between the plurality of nano-rods.

6. The LED of claim 5, wherein each of the plurality of nano-rods comprises:
   a first semiconductor layer doped with a first type of impurities;
   a second semiconductor layer that is not doped; and
   a third semiconductor layer doped with a second type of impurities opposite to the first type of impurities,
   wherein the second semiconductor layer is an active layer having a quantum well generating a light beam.

7. The LED of claim 1, wherein the light emitting unit comprises a plurality of nano-dashes each having a rectangular shape with a longer length than a width thereof,
   wherein the plurality of nano-dashes are arranged parallel to each other.

8. The LED of claim 7, wherein each of the plurality of nano-dashes comprises:
   a first semiconductor layer doped with a first type of impurities;
   a second semiconductor layer that is not doped; and
   a third semiconductor layer doped with a second type of impurities opposite to the first type of impurities,
   wherein the second semiconductor layer is an active layer having a quantum well generating a light beam.

9. The LED of claim 7, wherein a length 'L' and a width 'W' of each of the plurality of nano-dashes satisfy the inequalities $L/W \geq 5$ and $W \leq \lambda/(2n)$, where $\lambda$ is a wavelength of an emitted light beam and 'n' is a refraction index of a material of the plurality of nano-dashes.

10. The LED of claim 7, wherein a width 'W' of each of the plurality of nano-dashes is in the range of about 5 nm to about 500 nm, a length 'L' of each of the plurality of nano-dashes is in the range of about 50 nm to about 5 μm, and a pitch between the plurality of nano-dashes is in the range of about 5 nm to about 500 nm.

11. The LED of claim 7, wherein the plurality of conductive wires of the second wire grid polarizer are arranged in a direction perpendicular to a longitudinal direction of each of the plurality of nano-dashes.

12. The LED of claim 7, wherein a space between the plurality of nano-dashes is filled with a transparent dielectric layer.

13. The LED of claim 7, wherein the plurality of nano-dashes are surrounded by air.

14. The LED of claim 7, wherein a passivation-treatment is performed around lateral surfaces of the plurality of nano-dashes.

15. The LED of claim 1, wherein pitches between the conductive wires of the first wire grid polarizers and between the conductive wires of the second wire grid polarizers and a width of each of the conductive wires are less than $\lambda/2$, where $\lambda$ is a wavelength of an emitted light beam.

16. The LED of claim 15, wherein a thickness of each of the plurality of conductive wires of the first and second wire grid polarizers is in the range of about 20 nm to about 1000 nm.

17. The LED of claim 1, wherein the first and second wire grid polarizers are formed of any one selected from the group consisting of aluminum (Al), gold (Au), silver (Ag), palladium (Pd), titanium (Ti), platinum (Pt), ZrN, HfN, TiN, $ZrB_2$, $Cr_2N$, $MgB_2$, $NbB_2$, $HfB_2$, $AlB_2$, $Ta_2N$ and NbN, or a metal alloy thereof.

18. The LED of claim 1, wherein the reflective layer is formed of one selected from the group consisting of aluminum (Al), gold (Au), silver (Ag), palladium (Pd), titanium (Ti), platinum (Pt), ZrN, HfN, TiN, $ZrB_2$, $Cr_2N$, $MgB_2$, $NbB_2$, $HfB_2$, $AlB_2$, $Ta_2N$, NbN or a metal alloy thereof.

19. The LED of claim 1, wherein the phase retardation layer is formed of one selected from the semiconductor materials (In)(Al)GaN, (Al)(In)(Ga)(As)(P) or (Mg)ZnO and the dielectric materials $SiO_2$, $HfO_2$ or $SiN_x$, or any mixture thereof.

20. The LED of claim 1, further comprising:
   a buffer layer formed of a semiconductor material and between the wire grid polarizer and the light emitting unit.

21. A light emitting diode (LED) comprising:
   a reflective layer on a substrate;
   a light emitting unit on the reflective layer; and
   a wire grid polarizer on the light emitting unit and including a plurality of conductive wires arranged in parallel to each other,
   wherein the light emitting unit includes a plurality of nano-dashes having a rectangular shape with a longer length compared to a width thereof, the plurality of nano-dashes are arranged in parallel to each other, and
   wherein each of the reflective layer and the plurality of conductive wires function as an electrode.

22. The LED of claim 21, wherein each of the plurality of nano-dashes comprises:
   a first semiconductor layer doped with a first type of impurities;
   a second semiconductor layer that is not doped; and
   a third semiconductor layer doped with a second type of impurities opposite to the first type of impurities,
   wherein the second semiconductor layer is an active layer having a quantum well generating a light beam.

23. The LED of claim 21, wherein a length 'L' and a width 'W' of each of the plurality of nano-dashes satisfy the inequalities $L/W \geq 5$ and $W \leq \lambda/(2n)$, where $\lambda$ is a wavelength of an emitted light beam and 'n' is a refraction index of a material of the plurality of nano-dashes.

24. The LED of claim 21, wherein the plurality of conductive wires of the second wire grid polarizer are arranged in a direction perpendicular to a longitudinal direction of each of the plurality of nano-dashes.

25. The LED of claim 21, wherein a pitch between the plurality of conductive wires of the wire grid polarizer and a width of each of the plurality of conductive wires of the wire grid polarizer are less than $\lambda/2$, where $\lambda$ is a wavelength of an emitted light beam.

* * * * *